(12) United States Patent
Wang et al.

(10) Patent No.: US 9,915,005 B2
(45) Date of Patent: Mar. 13, 2018

(54) ADDITIVE C CAPABLE OF CHANGING MICROVIA-FILLING METHOD BY TSV COPPER PLATING, AND ELECTROPLATING SOLUTION CONTAINING SAME

(71) Applicant: SHANGHAI SINYANG SEMICONDUCTOR MATERIALS CO., LTD., Shanghai (CN)

(72) Inventors: Su Wang, Shanghai (CN); Xianxian Yu, Shanghai (CN); Li Ma, Shanghai (CN); Yanyan Li, Shanghai (CN)

(73) Assignee: SHANGHAI SINYANG SEMICONDUCTOR MATERIALS CO., LTD. (CN)

( * ) Notice: Subject to any disclaimer, the term of this patent is extended or adjusted under 35 U.S.C. 154(b) by 86 days.

(21) Appl. No.: 14/908,778

(22) PCT Filed: Dec. 10, 2013

(86) PCT No.: PCT/CN2013/001525
§ 371 (c)(1),
(2) Date: Jan. 29, 2016

(87) PCT Pub. No.: WO2015/017958
PCT Pub. Date: Feb. 12, 2015

(65) Prior Publication Data
US 2016/0168737 A1   Jun. 16, 2016

(30) Foreign Application Priority Data
Aug. 8, 2013 (CN) .......................... 2013 1 0343305

(51) Int. Cl.
*C25D 3/38* (2006.01)
*C25D 7/12* (2006.01)
(Continued)

(52) U.S. Cl.
CPC ............... *C25D 3/38* (2013.01); *C25D 7/123* (2013.01); *H01L 21/2885* (2013.01); *H01L 21/76898* (2013.01)

(58) Field of Classification Search
CPC .................................. C25D 3/38; C25D 7/123
See application file for complete search history.

(56) References Cited

FOREIGN PATENT DOCUMENTS

| CN | 1583935 | 2/2005 |
|---|---|---|
| CN | 1900219 | 1/2007 |

(Continued)

OTHER PUBLICATIONS

International Search Report dated Jul. 9, 2014 issued in corresponding International patent application No. PCT/CN2013/001525.

*Primary Examiner* — Stefanie S Wittenberg
(74) *Attorney, Agent, or Firm* — Ostrolenk Faber LLP

(57) ABSTRACT

An additive C capable of changing microvia-filling method by TSV copper plating, and electroplating solution containing same. The additive C contains by mass percentage: 5%-10%, one of polyethylene glycol or polyvinyl alcohol with the molecular weight of 200-100,000, or the mixture with different molecular weight thereof; 0.001%-0.5% isomer of the surfactant which including the alkylphenol polyoxyethylene ether or fatty alcohol-polyoxyethylene ether; and the solvent is water. The electroplating solution containing the additive C could be used for microvia-filling by TSV copper plating, the electroplating current distribution could be adjusted reasonably to realize the smooth transition between the conformal and bottom-up plating, so as to reduce the possibility of the seam or void in the coating, realize the high-speed electroplating, reduce the thickness of the copper layer, reduce the TSV plating duration and the cost of the chemical mechanical polishing (CMP), and significantly improve the production efficiency.

8 Claims, 4 Drawing Sheets

(51) Int. Cl.
  *H01L 21/288* (2006.01)
  *H01L 21/768* (2006.01)

(56) References Cited

FOREIGN PATENT DOCUMENTS

| CN | 101302635 | 11/2008 |
| CN | 101481812 | 7/2009 |
| CN | 102357748 | 2/2012 |
| CN | 103103585 | 5/2013 |
| CN | 103361681 | 10/2013 |

ADDITIVE C CAPABLE OF CHANGING MICROVIA-FILLING METHOD BY TSV COPPER PLATING, AND ELECTROPLATING SOLUTION CONTAINING SAME

CROSS REFERENCE TO RELATED APPLICATIONS

The present application is a 35 U.S.C. § 371 National Phase conversion of PCT/CN2013/001525, filed Dec. 10, 2013, which claims benefit of Chinese Application No. 201310343305.8, filed Aug. 8, 2013, the disclosure of which is incorporated herein by reference. The PCT International Application was published in the Chinese language.

TECHNICAL FIELD

This invention involves an additive C that can change the TSV microvia-filling method by TSV copper plating and the electroplating solution containing such additive.

BACKGROUND ART

TSV (Through-Silicon-Via) is the latest technology of making vertical breakover between chips, and wafers to realize the interconnection between chips. Different from the IC packaging bonding and the overlay technology employing salient points, TSV could maximize the density of the piling of the chips in the 3D directions, minimize the dimensions and significantly improve the operation speed of the chips and reduce power consumption.

The key element of the TSV electroplating and copper filling technique is that the copper shall be deposited in the height-depth-width ratio microvias without voids and seams During the electro-deposition, if the copper is plated on both sides and the bottom of the channel at the same plating rate, and that is the Conformal plating, seams may be easily formed in the center of the channel. If the plating rate of the upper part of the channel is higher than that of the lower part, there will be holes in the channel. Only if the plating rate at the bottom of the channel is higher than that at the sides of the channel, can the fully filling of the copper in the channel be ensured. This filling method is called super-conformal plating, or Bottom-up filling.

How to use appropriate process control to achieve super-conformal plating is the key for the filling of high aspect ratio microvia filling. Technically, the electroplating performance of high aspect ratio microvias depends on the equipment capacity, pre-treatment conditions, electroplating solutions, size distribution of micro holes, distribution of hole types and plating parameters.

SUMMARY OF THE INVENTION

The purpose of the invention is to develop an additive that can change the microvia-filling method by TSV copper plating to realize the transformation from the V-shaped filling and to the complete bottom-up filling, so as to improve the bonding between the plating layers and the base metal, reduce the possibility of seams or voids, realize the high-speed electroplating and reducing the thickness of copper layer.

To achieve the above purpose, this invention has provided an additive C capable of changing the microvia-filling method by TSV copper plating, which contains by mass percentage: 5%-10%, one of polyethylene glycol or polyvinyl alcohol with the molecular weight of 200-100,000, or the mixture with different molecular weight thereof; 0.001%-0.5% isomer of the surfactant which including the alkylphenol polyoxyethylene ether or fatty alcohol-polyoxyethylene ether; and the solvent is water. As to the above additive C capable of changing the microvia-filling method by TSV copper plating, the general formula of the fatty alcohol-polyoxyethylene ether is R—O—(CH$_2$CH$_2$O)n-H, which is obtained through the polycondensation of Alkyl alcohol and ethylene oxide. The reaction route is as follows:

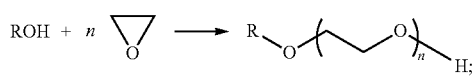

Where, R is the saturated or unsaturated alkyl, n is 10-20. The saturated or unsaturated alkyl is the alkyl of C12-18, or the linear chain alkyl or the alkyl with branch chains.

As to the above additive C capable of changing the microvia-filling method by TSV copper plating, the surfactant which is the alkylphenol polyoxyethylene ether contains one or more of the nonylphenol polyoxyethylene ether, polyoxyethylene octylphenol ether, polyoxyethylene dodecyl and di-nonylphenol polyoxyethylene ether.

As to the above additive C capable of changing the microvia-filling method by TSV copper plating, the solvent of the additive C is the high purity water with the resistivity of 18 MΩ·cm.

In this invention, an electroplating solution electroplating solution containing the additive C has also been provided, which contains 30-130 g/L copper ion and 5-50 g/L methanesulfonic acid, 20-150 mg/L chloridion; 1-30 ml/L accelerator A, 5-50 ml/L inhibitor S and 1-30 ml/L leveling agent L and 0.1-5 ml/L additive C.

In the above solution, the accelerator A is a sulfocompound containing one or several of the Dithiobis-1-Propanesulfonic Acid Disodium Salt, Sodium alcohlpropane sulfonate, Sodium phenyl Polydipropyl Sulfonate, Sodium dimethylformamide sulfonate, Sodium 3-(benzothiazol-2-ylthio)-1-propanesulfonate, Sodium 3-mercaptopropanesulphonate, Dimethyl-dithio-formamide sulfonic acid.

In the above solution, the inhibitor S is an oxygen-containing compound containing one of or the combination of the polyethylene glycol, alkoxide, ethylene oxide-propylene oxide segmented copolymer with the molecular weights of 400, 1000, 6000 and 20000, respectively.

In the above solution, the leveling agent L is one of or the combination of thiourea compounds, alkyl pyridine compounds, and janus green B compounds, and, one of or the combination of fatty alcohol-polyoxyethylene ether with different molecular weight, ether series, emulsifier TX series.

The invention has also provided an electroplating method employing the above electroplating solution, and the process conditions of the above electroplating are: current density: 0.01 A-10 A/dm$^2$, and temperature: 20-30° C.

In the above method, the mentioned electroplating method is the V-shaped filling with the low current density of 0.01-0.3 A/dm$^2$, and the U-shaped filling with the high current density of 0.5-10 A/dm$^2$.

The additive provided in the invention that can change the microvia-filling method by TSV copper plating has the following advantages:

The additive C provided in the invention has a good coordination function with the basic components (accelerator A, inhibitor S and leveling agent L), which could assist the diffusion and adsorption of the inhibitor S under the high current density, and strengthen the inhibition at the microvia walls. Meanwhile, the accelerator could accelerate the plating at the bottom of the microvia to realize the bottom-up plating. Under the low current density, the additive C will coordinate with the accelerator A, and the function of the inhibitor S will have weak performance, and the inhibition effect on the microvia walls will be reduced to realize the conformal plating. That is, the electroplating current distribution could be adjusted reasonably to realize the smooth transition between the conformal plating and bottom-up plating, so as to reduce the possibility of the seam or void in the coating, realize the high-speed electroplating, reduce the thickness of the copper layer, reduce the TSV plating duration and the cost of the chemical mechanical polishing (CMP), and significantly improve the production efficiency.

The electroplating solution in the invention has simple formula, easy maintenance and small environmental harm.

DESCRIPTION OF EMBODIMENTS

Figure 1:
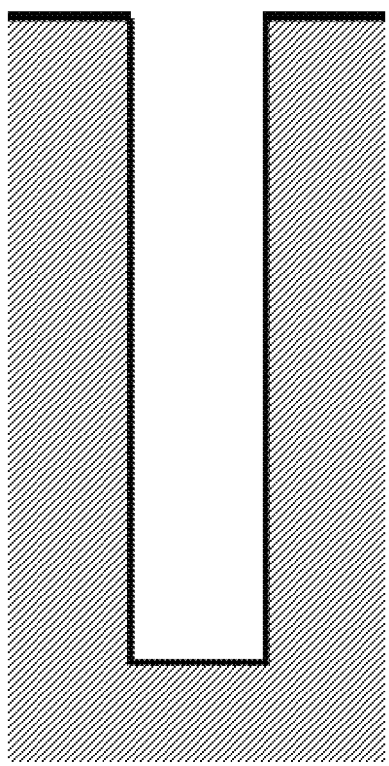
FIG. 1 is about the pattern of the microvia before TSV electroplating.
Figure 2:
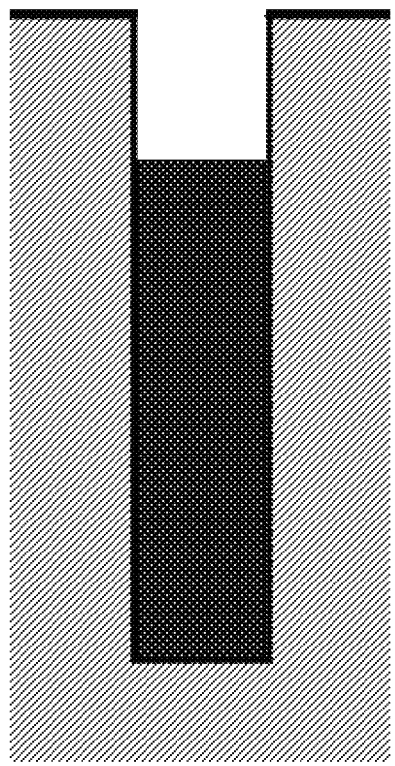
FIG. 2 is about the U-shaped filling of the microvia by TSV electroplating in the invention.
Figure 3:
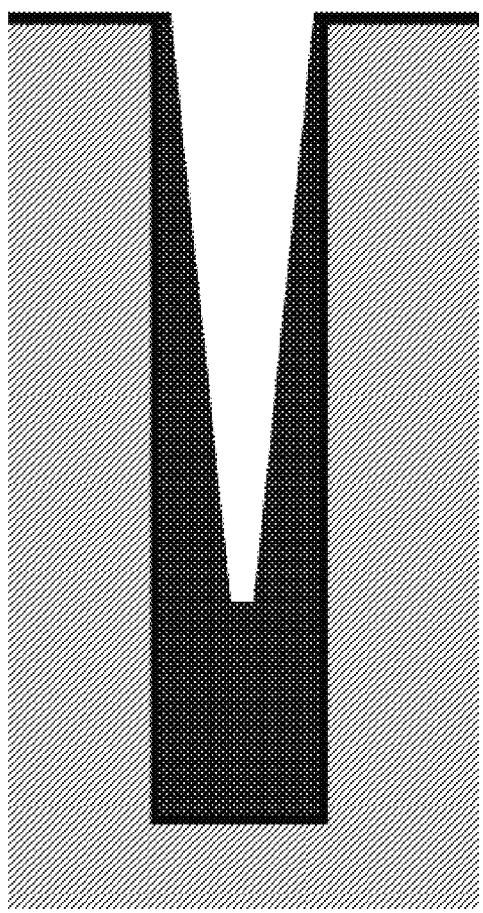
FIG. 3 is about the V-shaped filling of the microvia by TSV electroplating in the invention.

The detailed implementation method of the invention is further described hereunder with the attached figures.

The invention has provided an additive capable of changing microvia-filling method by TSV copper plating, which contains by the mass percent:

5%-10%, one of polyethylene glycol or polyvinyl alcohol with the molecular weight of 200-100,000, or the mixture with different molecular weight thereof; 0.001%-0.5% isomer of the surfactant which including the alkylphenol polyoxyethylene ether or fatty alcohol-polyoxyethylene ether; and the solvent is water.

The general formula of the fatty alcohol-polyoxyethylene ether is R—O—($CH_2CH_2O$)n-H, and the n is 10-20.

The present invention has provided the additive C that can change the microvia-filling method by TSV copper electroplating, which is the V-shaped filling under the low current density (0.01-0.3 $A/dm^2$) and the U-shaped filling under high current density (0.5-10 $A/dm^2$).

The accelerator A is a sulfocompound containing one or several of the Dithiobis-1-Propanesulfonic Acid Disodium Salt, Sodium alcohlpropane sulfonate, Sodium phenyl Polydipropyl Sulfonate, Sodium dimethylformamide sulfonate, Sodium 3-(benzothiazol-2-ylthio)-1-propanesulfonate, Sodium 3-mercaptopropanesulphonate, Dimethyl-dithioformamide sulfonic acid.

The inhibitor S is an oxygen-containing compound containing one f or the combination of the polyethylene glycol, alkoxide, ethylene oxide-propylene oxide (PO-EO) segmented copolymer with the molecular weights of 400, 1000, 6000 and 20000, respectively.

The leveling agent L is one of or the combination of thiourea compounds, alkyl pyridine compounds, and janus green B compounds, and one of or the combination of fatty alcohol-polyoxyethylene ether with different molecular weight, ether series, emulsifier TX series. Under the electric field, the accelerator, inhibitor and the leveling agent will work together to obtain a plating layer with reliable performance.

EXAMPLE 1

Preparation of additive C: put 10 g of polyethylene glycol 400 into 980 g of ultrapure water and stir the mixture for 15 minutes at 40° C.; and add 10 g of AEO-3(condensed by fatty alcohol and ethylene oxide) and 0.1 g of OP-10 (alkylphenol polyoxyethylene ether) while stirring. After stirring for 1 hour, prepare the electroplating solution for electroplating.

Preparation of the plating solution: in the hyperpure copper methylsulfonate electroplating solution , add the 5 ml/L UPT3360A (accelerator A), 10 ml/L UPT3360S (inhibitor S), 10 ml/L UPT3360L (leveling agent L) from Shanghai Sinyang Semiconductor Materials Co., Ltd. and 1 ml/L of the above additive C. Stir the mixture for 30 minutes before starting plating.

Take 20×100 μm microvia as instance,

Pre-treatment: vacuumize for 5 minutes at the vacuum degree of 0-0.2 torr, and immerse with pure water for 1-10 minutes.

VMS ratio: Cu=100 g/L H=30 g/L;

Additive ratio: UPT3360A:UPT3360S:UPT3360L:C=5: 10:10:1;

Test condition: temperature=22-25° C.; flow rate=15 L/min; negative pole rotation speed=50 RPM;

Plating parameter: 0.01 ASD 120 s; 0.1 ASD 900 s; 0.6 ASD 3000 s.

EXAMPLE 2

Preparation of additive C: put 10 g of polyethylene glycol 200 and 1 g of polyethylene glycol 2000 into 979 g of ultrapure water and stir the mixture for 15 minutes at 40° C.; and add 10 g polyoxyethylene octylphenol ether and 0.1 g of TX-10 (polyoxyethylene octylphenol ether) while stirring. After stirring for 1 hour, prepare the electroplating solution for electroplating.

Preparation of the plating solution: in the hyperpure copper methylsulfonate electroplating solution, add the 3 ml/L UPT3360A, 10 ml/L UPT3360S, 5 ml/L UPT3360L from Shanghai Sinyang Semiconductor Materials Co., Ltd. and 1 ml/L of the above additive C. Stir the mixture for 30 minutes before starting plating.

Take 10×100 μm microvia as instance,

Pre-treatment: vacuumize for 5 minutes at the vacuum degree of 0-0.2 torr, and immerse with pure water for 1-10 minutes.

VMS ratio: Cu=80 g/L H=15 g/L;

Additive ratio: UPT3360A:UPT3360S :UPT3360L:C=3: 10:5:1;

Test condition: temperature=22-25° C.; flow rate=15 L/min; negative pole rotation speed=50 RPM;

Plating parameter: 0.01 ASD 120 s; 0.7 ASD 300 s; 0.1 ASD 600 s; 0.5 ASD 1200 s; 0.3 ASD 300 s; 0.1 ASD 600 s.

Treatment after the electroplating: wash the wafer by deionized water for 2 mins, and blow dry.

Figure 4:
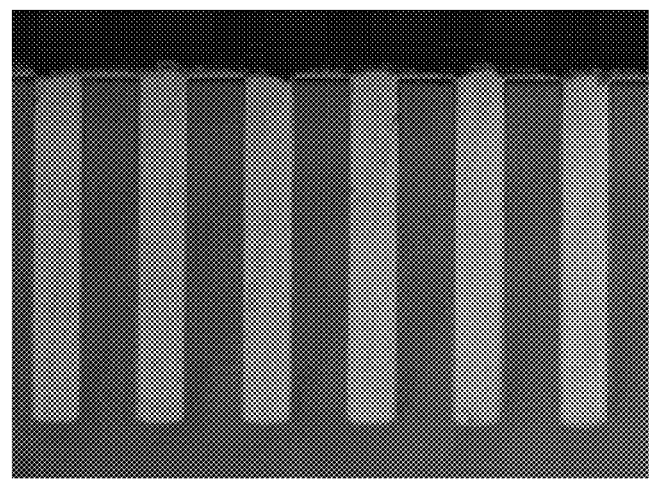
FIG. 4 is about the section analysis result of the TSV microvia completely plated by the electroplating solution containing the said additive in the invention.

Analysis, test and evaluation of the plating samples obtained from the example 1 and example 2:

1. Section analysis: make sections from the samples according to the hole patterns, seal the samples with specific epoxy curing material for polishing and check for the electroplating flaws under metalloscope or under SEM (Scanning Electron microscope), see FIG. 4 for results. According to the analysis of the section after the electroplating with electroplating solution containing the additive C in the invention, the plating layer is uniform without flaw and the copper layer is thin.

Figure 5:
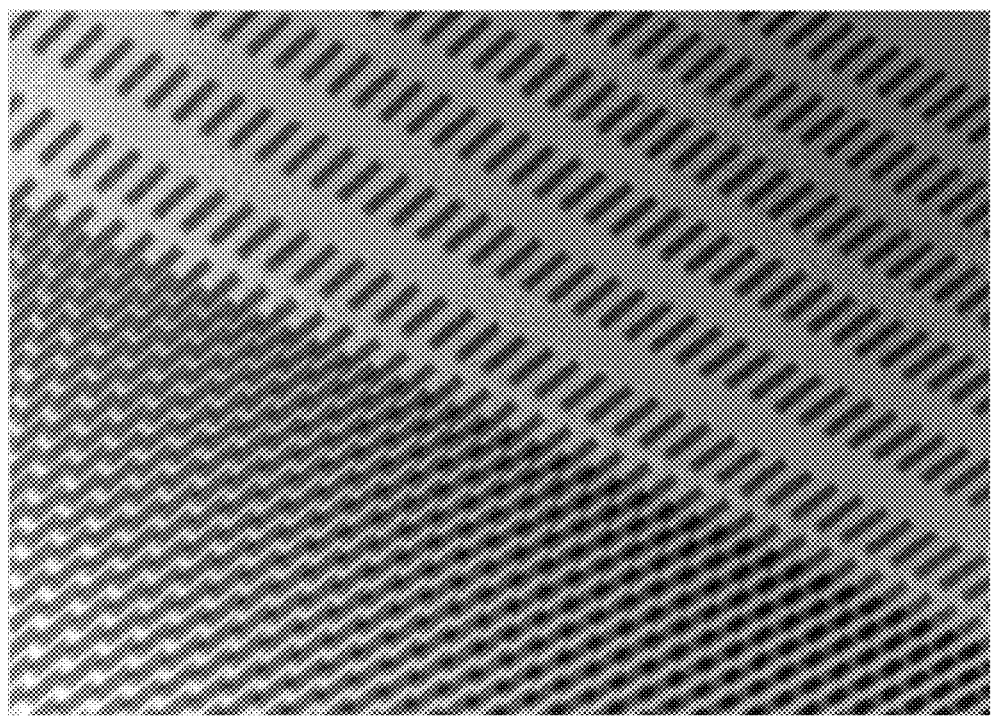
FIG. 5 is about the X-ray analysis results of the TSV microvia completely plated by the electroplating solution containing the said additive in the invention.

2. None intrusive detection: Check the filling performance and electroplating uniformity of the microvias with the X-ray detection equipment, see FIG. 5 for the results. According to the X-ray detection of the whole safer, the microvias are filled uniformed without missing plating or unevenness.

The TSV samples prepared with the electroplating method provided in the invention for the 3D copper interconnected height-depth-width ratio TSV microvias has smooth appearances and good uniformity without void or seam, which could meet the requirements.

Despite the detailed introduction to the invention as above, the above introduction could not be considered as the limitation to the invention. After the person skilled in the art has read the above contents, the modifications and alternations of the invention will be obvious. Therefore, the protection scope of the invention shall be limited by the attached claims.

What is claimed is:

1. An electroplating solution comprising:
   30-130 g/L copper ions;
   5-50 g/L methanesulfonic acid;
   20-150 mg/L chloride ion;
   1-30 ml/L accelerator A;
   5-50 ml/L inhibitor S;
   1-30 ml/L leveling agent L; and
   an additive C used for TSV copper plating, wherein the additive C consists of, by mass percentage, 5%-10%, one of polyethylene glycol or polyvinyl alcohol with a molecular weight of 200-100,000, or a mixture of polyethylene glycol with different molecular weights of 200-100,000 or a mixture of polyvinyl alcohol with different molecular weights of 200-100,000 or a mixture of polyethylene glycol and polyvinyl alcohol with different molecular weights of 200-100,000;
   0.001%-0.5% alkylphenol polyoxyethylene ether or fatty alcohol-polyoxyethylene ether; and
   water as a solvent:
   wherein a general formula of the fatty alcohol-polyoxyethylene ether is R—O—(CH$_2$CH$_2$O)n-H, R being C12-18, a saturated or unsaturated linear chain alkyl or an alkyl with branch chains, and n being 10-20; and
   wherein the alkylphenol polyoxyethylene ether contains one or more of nonylphenol polyoxyethylene ether, polyoxyethylene octylphenol ether, polyoxyethylene dodecyl and dinonylphenol polyoxyethylene ether;
   wherein additive C is included in the amount of 0.1-5 ml/L.

2. The electroplating solution of claim 1, wherein, the accelerator A is a sulfur compound containing one or several of the dithiobis-1-propanesulfonic acid disodium salt, sodium alcohlpropane sulfonate, sodium phenyl polydipropyl sulfonate, sodium dimethylformamide sulfonate, sodium 3-(benzothiazol-2-ylthio)-1-propanesulfonate, sodium 3-mercaptopropanesulphonate, dimethyl-dithio-formamide sulfonic acid.

3. The electroplating solution of claim 1, wherein, the inhibitor S is an oxygen-containing compound, containing one of or a combination of alkoxide, ethylene oxide-propylene oxide segmented copolymer, and polyethylene glycol with molecular weights of 400, 1000, 6000 and 20000, respectively.

4. The electroplating solution of claim 1, wherein, the leveling agent L consists of: 1) one of or a combination of thiourea compounds, alkyl pyridine compounds and janus green B compounds; and, 2) one of or a combination of fatty alcohol-polyoxyethylene ether, ether series, emulsifier TX series.

5. An electroplating method employing the electroplating solution of claim 1, wherein, process conditions of the electroplating are: current density: 0.01 A-10 A/dm$^2$, and temperature: 20-30° C.

6. The method of claim 5, wherein, V-shaped filling is used under low current density of 0.01-0.3 A/dm$^2$ circumstance, and, U-shaped filling is used under high current density of 0.5-10 A/dm$^2$ circumstance.

7. The electroplating solution of claim 1, wherein the fatty alcohol-polyoxyethylene ether is obtained through polycondensation of alkyl alcohol and ethylene oxide, a reaction route is as follows:

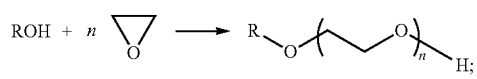

R is C12-18, a saturated or unsaturated linear chain alkyl or an alkyl with branch chains, and n is 10-20.

8. The electroplating solution of claim 1, wherein the solvent of additive C is high purity water with resistivity of 18 MΩ·cm.

* * * * *